United States Patent
Kitani

(10) Patent No.: US 10,795,397 B2
(45) Date of Patent: Oct. 6, 2020

(54) CURRENT-VOLTAGE CONVERTOR, REFERENCE VOLTAGE GENERATOR AND NON-VOLATILE SEMICONDUCTOR STORAGE DEVICE

(71) Applicant: Powerchip Semiconductor Manufacturing Corporation, Hsinchu (TW)

(72) Inventor: Tomofumi Kitani, Tokyo (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/543,634

(22) Filed: Aug. 19, 2019

(65) Prior Publication Data

US 2020/0278714 A1    Sep. 3, 2020

(30) Foreign Application Priority Data

Mar. 1, 2019   (JP) ................................. 2019-037526

(51) Int. Cl.
*G05F 3/26*   (2006.01)
*G11C 5/14*   (2006.01)
*G11C 16/30*  (2006.01)

(52) U.S. Cl.
CPC ............... *G05F 3/26* (2013.01); *G11C 5/147* (2013.01); *G11C 16/30* (2013.01)

(58) Field of Classification Search
CPC ........... G05F 3/26; G11C 5/147; G11C 16/30; G11C 16/08
See application file for complete search history.

(56) References Cited

U.S. PATENT DOCUMENTS

| 7,420,856 B2 | 9/2008 | Chae et al. | |
|---|---|---|---|
| 2008/0122537 A1* | 5/2008 | Miyata | H03F 3/3022 330/253 |
| 2012/0032733 A1* | 2/2012 | Negoro | G06F 1/28 327/537 |

(Continued)

FOREIGN PATENT DOCUMENTS

| CN | 101964212 | 2/2011 |
|---|---|---|
| EP | 0640974 | 12/1999 |

(Continued)

*Primary Examiner* — Jue Zhang
*Assistant Examiner* — Trinh Q Dang
(74) *Attorney, Agent, or Firm* — JCIPRNET

(57) ABSTRACT

A stable reference voltage that can be supplied in a layout area smaller than prior art is provided. A current-voltage convertor includes a first current mirror circuit including a first MOS transistor, a second MOS transistor in a pair, and an output resistor; and a depletion type N-channel MOS transistor, inserted between a first voltage to be input and the first MOS transistor and the second MOS transistor, and having a gate to which an output voltage from the output resistor is fed back. When a reference current is input to the first MOS transistor, the output voltage is generated by a current corresponding to the reference current flowing into the second MOS transistor and the output resistor. In addition, a reference voltage generator including the current-voltage convertor is provided to output a reference voltage based on the output voltage of the current-voltage convertor.

8 Claims, 10 Drawing Sheets

(56) References Cited

U.S. PATENT DOCUMENTS

| | | |
|---|---|---|
| 2014/0152378 A1 | 6/2014 | Yang |
| 2019/0122739 A1* | 4/2019 | Bonitz .............. G11C 16/3418 |
| 2019/0243406 A1* | 8/2019 | Sakaguchi ............. G05F 3/262 |

FOREIGN PATENT DOCUMENTS

| | | |
|---|---|---|
| JP | 2013196622 | 9/2013 |
| TW | 200625304 | 7/2006 |
| TW | 201123195 | 7/2011 |
| TW | I345240 | 7/2011 |
| TW | 201224698 | 6/2012 |
| TW | I621326 | 4/2018 |

* cited by examiner

Comparative example

First embodiment

Second embodiment

CURRENT-VOLTAGE CONVERTOR, REFERENCE VOLTAGE GENERATOR AND NON-VOLATILE SEMICONDUCTOR STORAGE DEVICE

CROSS-REFERENCE TO RELATED APPLICATION

This application claims the priority benefit of Japan application serial no. 2019-037526, filed on Mar. 1, 2019. The entirety of the above-mentioned patent application is hereby incorporated by reference herein and made a part of this specification.

BACKGROUND OF THE INVENTION

1. Field of the Invention

The invention relates a current-voltage convertor, a reference voltage generator using the current-voltage convertor, and a non-volatile semiconductor storage device using the reference voltage generator.

2. Description of Related Art

FIG. 1 is a block diagram showing a configuration example of a voltage generator used in an NAND flash memory in prior art. For non-volatile semiconductor storage devices such as the NAND flash memory, a variety of voltages are required to perform READ, PROGRAM and ERASE operations. In general, as shown by FIG. 1, those voltages are generated by voltage generators including a charge pump circuit 21 and a regulator circuit 22, and supplied to a memory array 10 via a word line decoder circuit 11.

PRIOR ART DOCUMENT

Patent Document

Patent Document 1: Japanese Patent Publication No. 2013-196622

SUMMARY OF THE INVENTION

Problems to be Solved by the Invention

However, ripple voltage which exists in the output voltage from the charge pump circuit 21 affects the stress of the memory cell, and has a dependency issue to the position of word line (FIG. 1). Although certain voltages are supplied from the regulator circuit 22 to reduce the ripple voltage, it requires extra layout area.

To solve the above problems, the invention provides a current-voltage convertor that supplies stable reference voltage with smaller layout area than prior art, a reference voltage generator using the current-voltage convertor, and a non-volatile semiconductor storage device using the reference voltage generator.

Means for Solving the Problems

The current-voltage convertor of the invention includes: a first current mirror circuit which composed of a pair of a first metal-oxide semiconductor (MOS) transistor and a second MOS transistor and an output resistor; and a depletion type N-channel MOS transistor which inserts between a first voltage as input and the pair of the first MOS transistor and the second MOS transistor, and having a gate connected to the output voltage from the output resistor. When a reference current is input to the first MOS transistor, the output voltage is generated by the current corresponding to the reference current via the second MOS transistor and the output resistor.

Effect of the Invention

As a result, the current-voltage convertor that supplies stable reference voltage with smaller layout area than prior art, the reference voltage generator using the current-voltage convertor, and the non-volatile semiconductor storage device using the reference voltage generator may be provided according to the invention.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
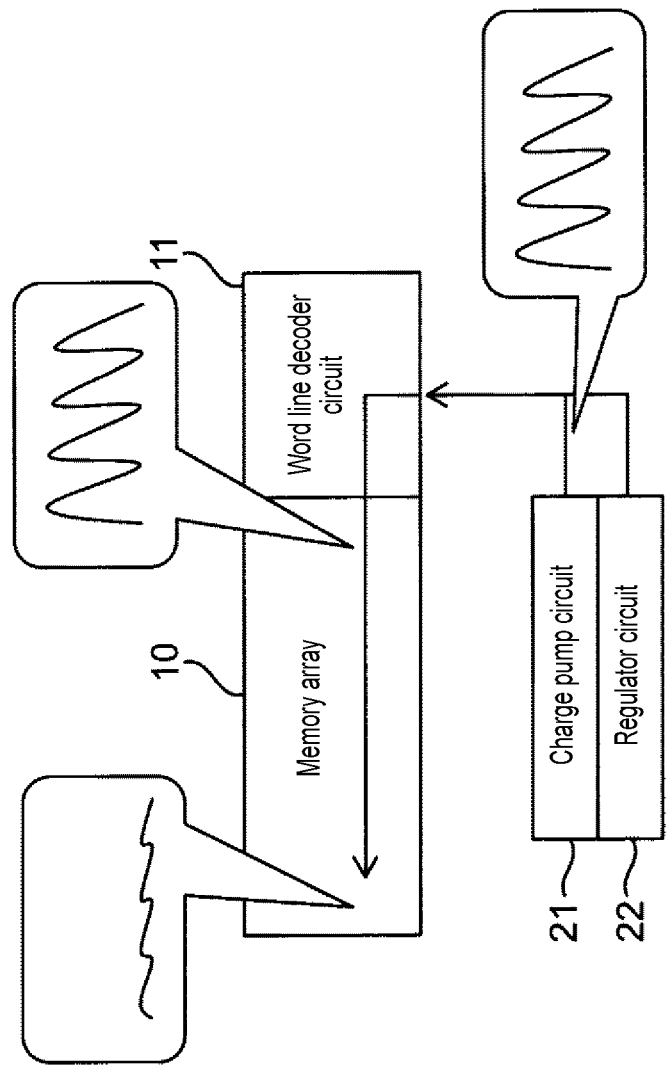
FIG. 1 is a block diagram showing a configuration example of a voltage generator used in an NAND flash memory in prior art.

Reference will be made in detail to the present preferred embodiments of the disclosure, examples of which are illustrated in those accompanying drawings. Wherever possible, the same reference numbers are used in the drawings and the description to refer to the same or like parts.

The embodiments of the invention will be described below with reference to accompanied drawings. Further, the same reference numbers are used in the drawings for the same or similar components.

Comparative Example

Figure 2A:
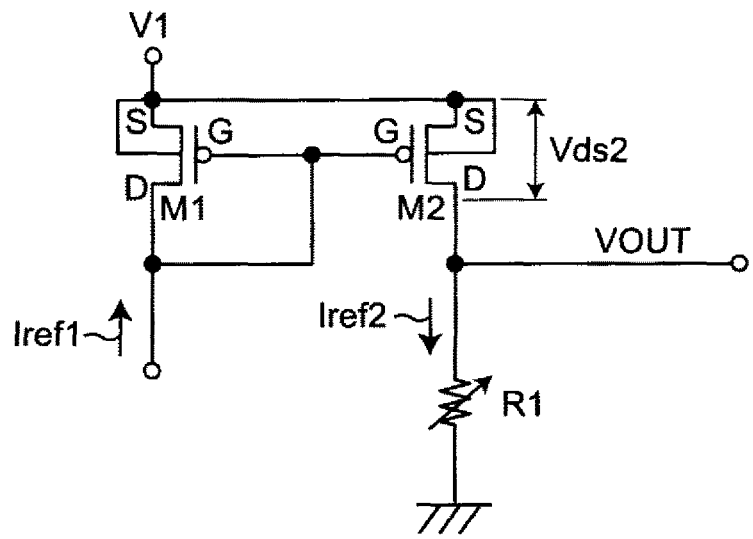
FIG. 2A is a circuit diagram showing a configuration example of a current-voltage convertor in a comparative example.

FIG. 2A is a circuit diagram showing a configuration example of a current-voltage convertor. Patent Document 1 is an example to disclose a current-voltage convertor using a current mirror circuit.

FIG. 2A shows a simple current mirror circuit for converting current into voltage, which is configured by a pair of P-channel MOS transistors M1 and M2. Herein, the gate and the source of the MOS transistor M1 are connected to the gate and the source of the MOS transistor M2, and the gate of each of the MOS transistor M1 and the MOS transistor M2 is connected to a drain of the MOS transistor M1. A variable resistor R1 for adjusting an output voltage VOUT is connected between the drain of the MOS transistor M2 and the ground. Further, the variable resistor R1 may be implemented by using, for example, a half fixed resistor that can be set by digital signals.

In the current-voltage convertor described above, a power voltage V1 is applied to the source of each of the MOS transistor M1 and the MOS transistor M2. Since the MOS transistor M1 and the MOS transistor M2 are used to configure the current mirror circuit, a reference current Iref1 flows into the MOS transistor M1, the transistor M2 generates a current Iref2 corresponding to the reference current Iref1 and flows out to the variable resistor R1. Hereby, the variable resistor R1 as the output resistance generates the output voltage VOUT.

Herein, the output voltage VOUT needs to take into consideration a breakdown voltage BVds2 between the drain and the source of the MOS transistor M2. Since the output voltage VOUT may be set to, for example, 0V, the power voltage V1 needs to be lower than the breakdown voltage BVds2.

First Embodiment

Figure 2B:
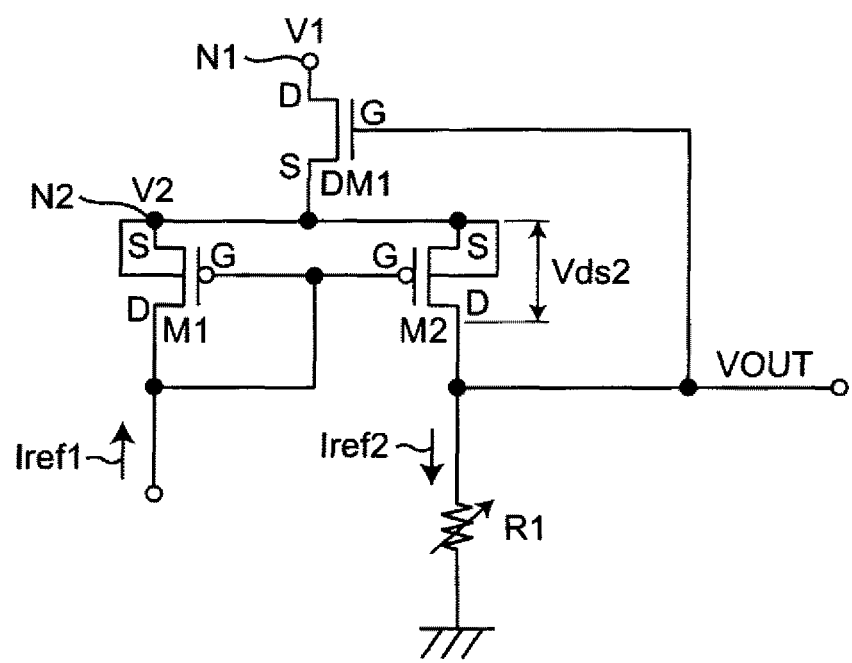
FIG. 2B is a circuit diagram showing a configuration example of a current-voltage convertor in first embodiment.

FIG. 2B is a circuit diagram showing a configuration example of a current-voltage convertor in first embodiment. The current-voltage convertor of FIG. 2B differs from the current-voltage convertor of FIG. 2A in the following point.

(1) A depletion type N-channel MOS transistor DM1 is inserted between the power voltage V1 and the node which tied the source of the MOS transistors M1 and M2 together.

In FIG. 2B, the drain of the MOS transistor DM1 is connected to the power voltage V1, and the source of the MOS transistor DM1 is connected to each of the sources of the MOS transistor M1 and the MOS transistor M2. The gate (a control terminal) of the MOS transistor DM1 is connected to one side of the variable resistor R1 and the terminal of the output voltage VOUT. Further, the voltage at each of the sources of the MOS transistor M1 and the MOS transistor M2 is set to V2.

In the current-voltage convertor described above, the current mirror circuit is configured by the pair of MOS transistors M1 and M2. Herein, the depletion type N-channel MOS transistor DM1 is inserted between a node N2 with the voltage V2 and a node N1 with the voltage V1, the gate of the MOS transistor DM1 is connected to the terminal of the output voltage VOUT, and the output voltage VOUT is fed back to the gate. Hereby, a current corresponding to the output voltage VOUT and flowing into the MOS transistor DM1 is controlled, and it controls the voltage V2 of the node N2.

Figure 2C:
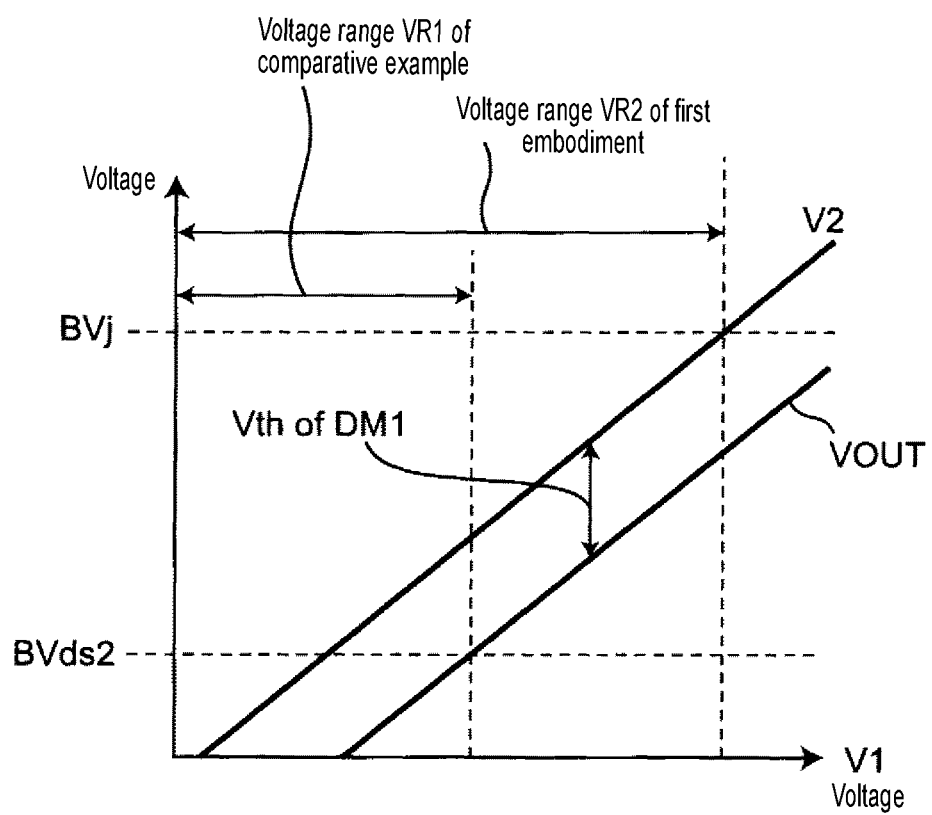
FIG. 2C is a graphic chart showing a comparison between operations of the current-voltage conversion circuits of FIG. 2A and FIG. 2B.

FIG. 2C is a graphic chart to compare operations of the current-voltage convertor between FIG. 2A and FIG. 2B.

Since the depletion type N-channel MOS transistor DM1 has a negative threshold voltage Vth, as FIG. 2C shows, the voltage V2 of the node N2 follows VOUT+Vth of the MOS transistor DM1. This means that the breakdown voltage BVds2 is constantly held around the threshold voltage Vth of the MOS transistor DM1. Therefore, as long as the threshold voltage Vth of the MOS transistor DM1 is less than the breakdown voltage BVds2, the output voltage VOUT is possible to supply higher voltage than the current-voltage convertor of FIG. 2A.

The next breakdown voltage higher than the breakdown voltage Vds2 of the MOS transistor DM1 is junction breakdown voltage BVj. If the voltage V1 is set close to the junction breakdown voltage BVj, the maximum value of the output voltage VOUT is approximately V1−Vth.

Based on the description above, as apparent from FIG. 2C, because of the threshold voltage Vth of the MOS transistor DM1, a voltage range VR2 of the current-voltage convertor of FIG. 2B is greatly expanded from a voltage range VR1 of the current-voltage convertor of FIG. 2A. Further, the current-voltage convertor of FIG. 2B constitutes a reference voltage generator for generating the output voltage VOUT that is a reference voltage corresponding to the reference current Iref1.

Second Embodiment

Figure 3:
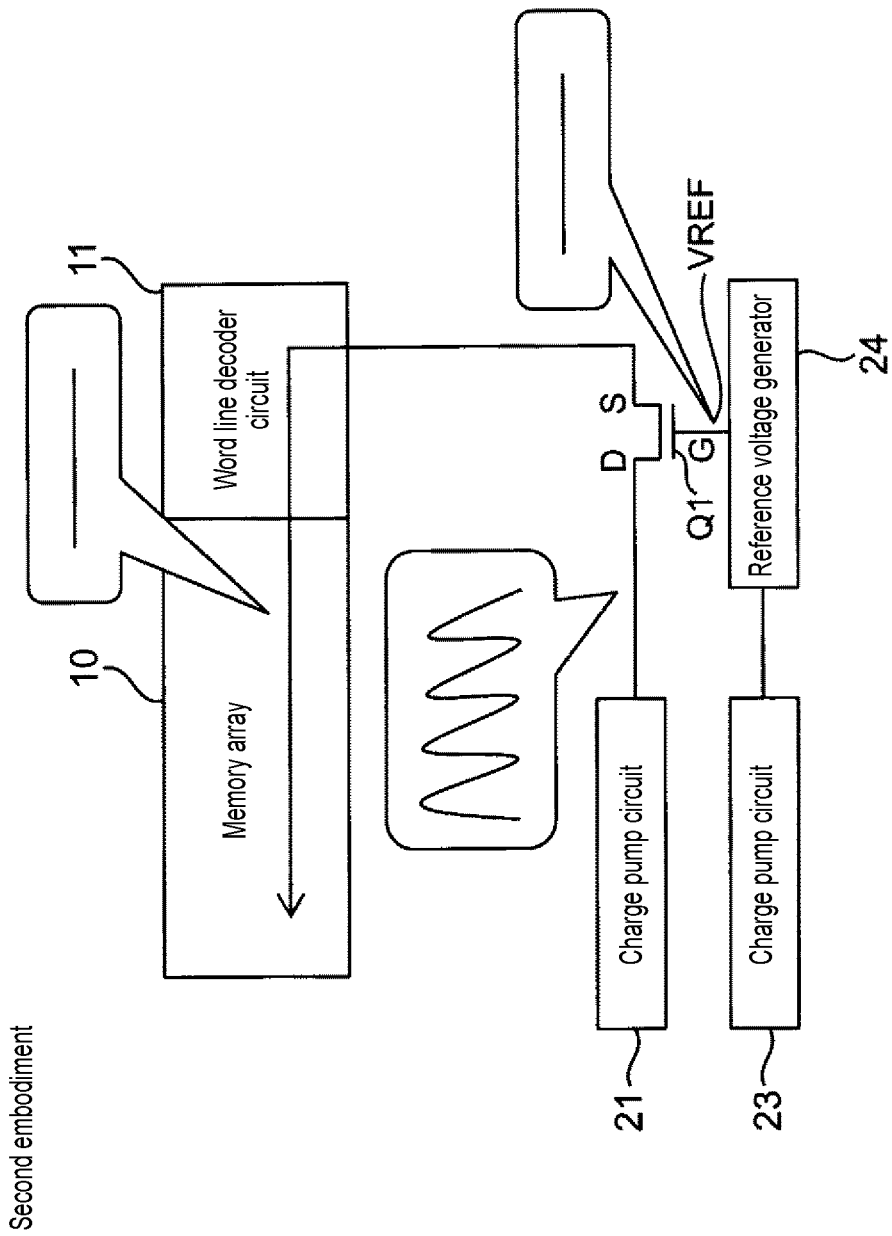
FIG. 3 is a block diagram showing a configuration example of a voltage generator used in an NAND flash memory in second embodiment.

FIG. 3 is a block diagram showing a configuration example of a voltage generator used in an NAND flash memory in second embodiment.

In FIG. 3, a reference voltage generator 24 is a reference voltage generator composed of the current-voltage convertor including the current mirror circuit in the first embodiment, which generates reference voltage VREF from a charge pump circuit 23 and applies the reference voltage VREF to a gate of a MOS transistor Q1. On the other hand, a clamping operation is performed by using the MOS transistor Q1 to clamp the voltage from the charge pump circuit 21 to be lower than a predetermined voltage corresponding to the reference voltage VREF. This clamp type is also known as a clamp MOS type. The MOS transistor Q1 of the clamp MOS type of FIG. 3 supplies the predetermined voltage of which the ripple voltage reduced more than prior art, as the word line voltage forces to the word line decoder circuit 11 and the word lines of the memory array 10.

Figure 4:
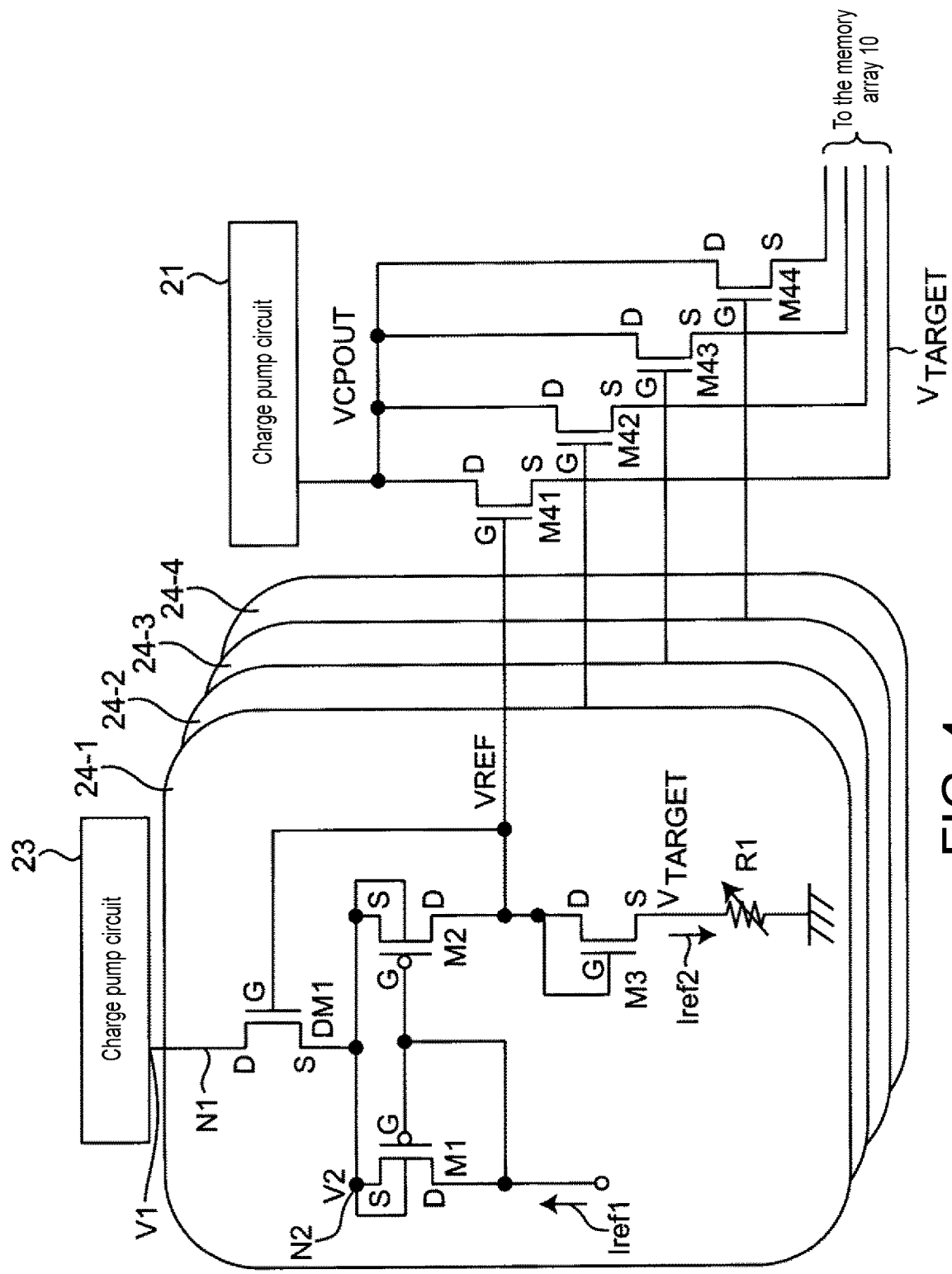
FIG. 4 is a circuit diagram showing a configuration example of a voltage generator including a reference voltage generator which consist of the current-voltage convertor of FIG. 2B.

FIG. 4 is a circuit diagram showing a configuration example of a voltage generator including the reference voltage generator using the current-voltage convertor of FIG. 2B. In FIG. 4, the voltage generator is composed of the charge pump circuit 21 and 23, a plurality of reference voltage generators 24-1 to 24-4 and a plurality of MOS transistors M41 to M44 as the clamp MOS type.

In FIG. 4, each of the reference voltage generators 24-1 to 24-4 is characterized by adding MOS transistor M3 to configure the current mirror circuits with MOS transistor M41 to M44 as the clamp MOS type between the MOS transistor M2 and the variable resistor R1 on the reference voltage generator using the current-voltage convertor of FIG. 2B. Herein, the gate and the drain of the MOS transistor M3 are tied together.

Circuit operations related to the reference voltage generator 24-1 and the MOS transistor M41 are described as follows. Based on the voltage V1 from the charge pump circuit 23, the reference voltage generator 24-1 applies the reference voltage VREF which stands for the output voltage VOUT corresponding to the reference current Iref1 to the gate of the MOS transistor M41. The MOS transistor M3 and the MOS transistor M41 constitute the current mirror circuit, and the charge pump voltage VCPOUT is applied to the drain of the MOS transistor M41 from the charge pump circuit 21. Among those circuits, the current corresponding to the current Iref2 flowing into the MOS transistor M3 flows into the MOS transistor M41, and the target voltage $V_{TARGET}$ as the source voltage of the MOS transistor M3 supplies the clamped reference voltage to the source of the MOS transistor M41 of the clamp MOS type.

Furthermore, the circuit of the reference voltage generator 24-2 and the MOS transistor M42, the circuit of the reference voltage generator 24-3 and the MOS transistor M43 and the circuit of the reference voltage generator 24-4 and the MOS transistor M44 also work as the circuit described above.

According to the voltage generator of FIG. 4 described above, due to a mirror effect in the current mirror circuit, the target voltage $V_{TARGET}$ is correctly transmitted to the memory array 10, and the ripple voltage from the charge pump circuit 21 and the charge pump circuit 23 are reduced dramatically.

Second Embodiment

Figure 5:
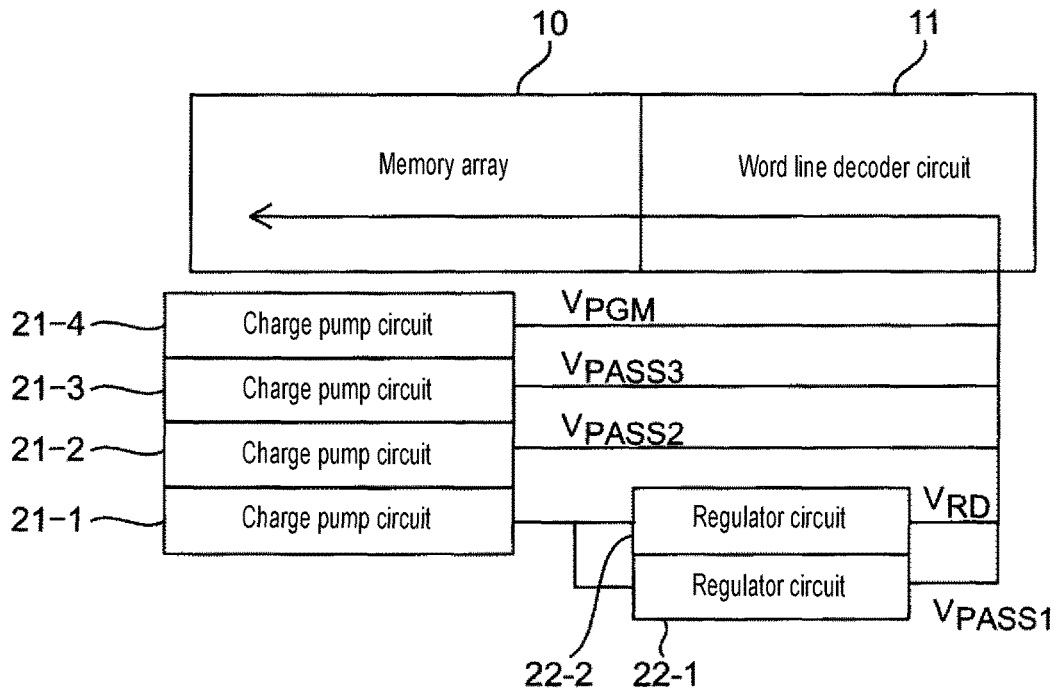
FIG. 5 is a block diagram showing a specific configuration example of a voltage generator used in an NAND flash memory in second embodiment.

FIG. 5 is a block diagram showing a specific configuration example of a voltage generator used in an NAND flash memory in second embodiment.

In FIG. 5, the voltage generator is configured by charge pump circuits 21-1 and 21-4 and regulator circuits 22-1 and 22-2 in order to supply following various voltages for the NAND flash memory to the memory array 10 via the word line decoder circuit 11.
 (1) a programming voltage VPGM;
 (2) a voltage $V_{PASS1}$/a voltage $V_{PASS2}$/a voltage $V_{PASS3}$ for unselected word lines;
 (3) a read or verify voltage $V_{RD}$;
 (4) a select gate voltage $V_{SG}$;
 (5) other voltages.

Herein, the regulator circuits 22-1 and the regulator circuit 22-2 are configured by the reference voltage generator above. In particular, the voltage $V_{PASS1}$ and the voltage $V_{RD}$, which need to be more accurate and to reduce the ripple voltage, are generated by the regulator circuit 22-1 and the regulator circuit 22-2.

Figure 6A:
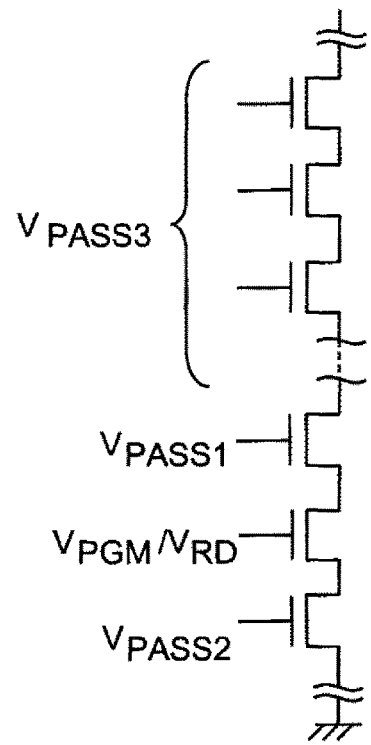
FIG. 6A is a circuit diagram illustrating conditions for applying various operating voltages on a lower voltage side of word line in second embodiment.
Figure 6B:
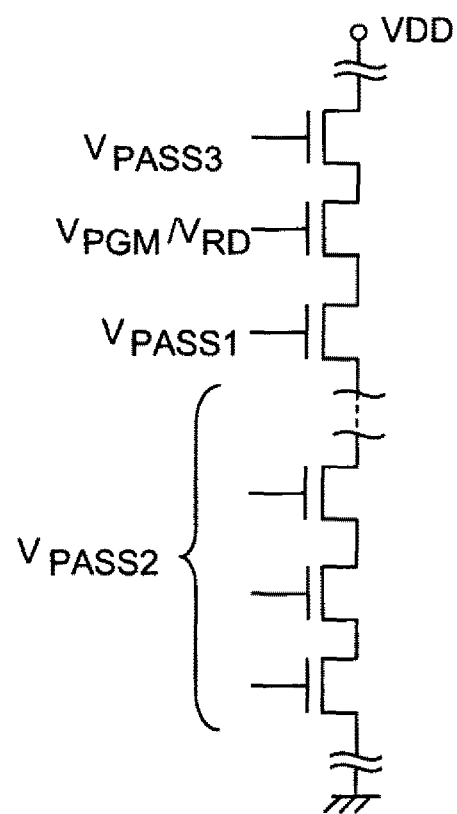
FIG. 6B is a circuit diagram illustrating conditions for applying various operating voltages on a higher voltage side of word line in second embodiment.

FIG. 6A is a circuit diagram illustrating conditions for applying various operating voltages on a low voltage side of word line in second embodiment. Further, FIG. 6B is a circuit diagram illustrating conditions for applying various operating voltages on a high voltage side of word line in second embodiment.

FIG. 6A is a diagram illustrating the conditions for the operating voltages applied to the lower voltage side of word line, and the circuit for the voltage $V_{PASS3}$ has the heaviest load. On the other hand, if the selected word line moves to the higher voltage side, as shown by FIG. 6B, the loading in the voltage $V_{PASS3}$ is significantly reduced, whereas the circuit with the voltage $V_{PASS2}$ goes the heaviest load. In particular, those circuits require covering wide range of loading, and those circuits get larger in area.

Third Embodiment

Figure 7:
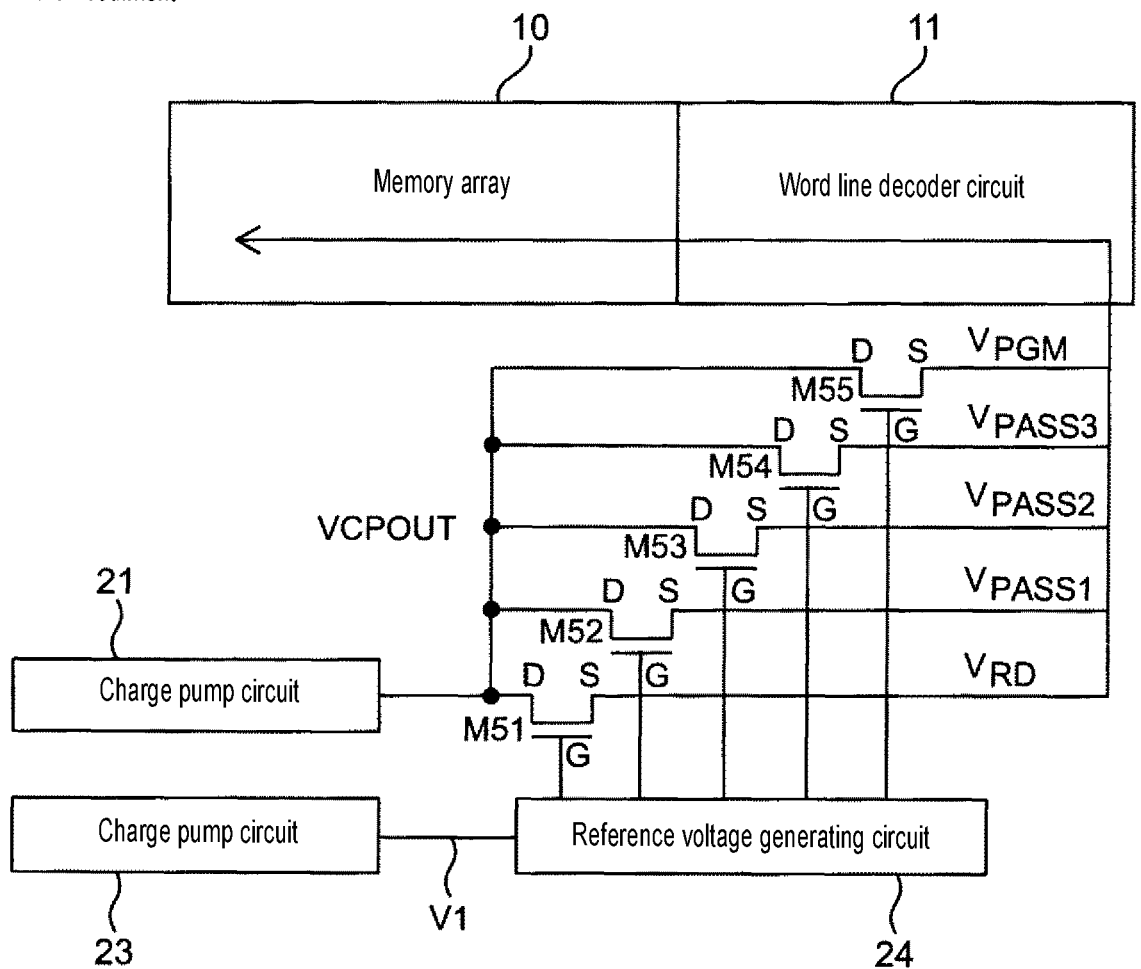
FIG. 7 is a block diagram showing a configuration example of a voltage generator used in an NAND flash memory in third embodiment.

FIG. 7 is a block diagram showing a specific configuration example of a voltage generator used in an NAND flash memory in third embodiment.

In FIG. 7, the reference voltage generator 24 is configured by the circuit of FIG. 4. Herein, it generates the predetermined reference voltage VREF based on the voltage V1 from the charge pump circuit 23, and applies the reference voltage VREF to each gates of the MOS transistors M51 to M55 of the clamp MOS type. On the other hand, based on the charge pump voltage VCPOUT from the charge pump circuit 21, the MOS transistors M51 to M55 of the clamp MOS type generate predetermined and necessary voltages to be supplied to the memory array 10 via the word line decoder circuit 11.

The voltage generator of FIG. 7 includes the charge pump circuit 21. If the charge pump circuit is used, the total of loading remains the same and various voltages are generated regardless of the position of the selected word line so the layout area is saved.

Figure 8:
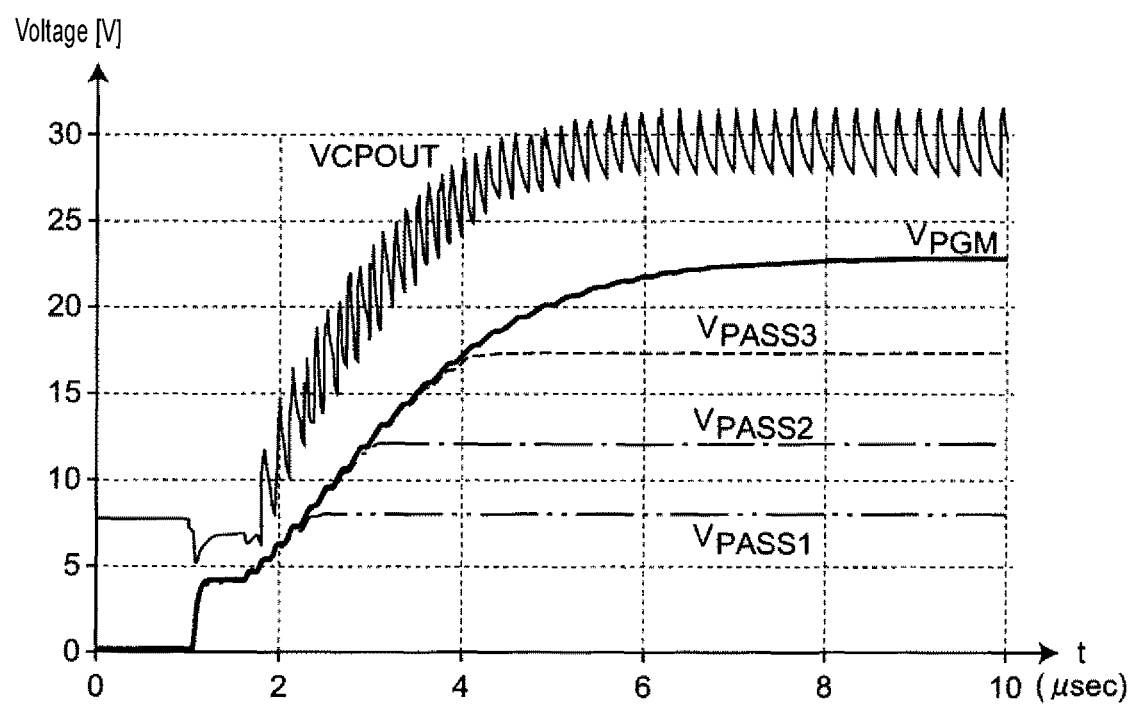
FIG. 8 is a waveform by using the voltage generator of FIG. 7.

FIG. 8 is the waveform showing an example by the voltage generator of FIG. 7. As apparent from FIG. 8, the charge pump voltage VCPOUT from the charge pump circuit still has some ripple voltage, but the ripple voltage is sufficiently reduced after passing through MOS transistors M51 to M55 of the clamp MOS type.

Fourth Embodiment

Figure 9:
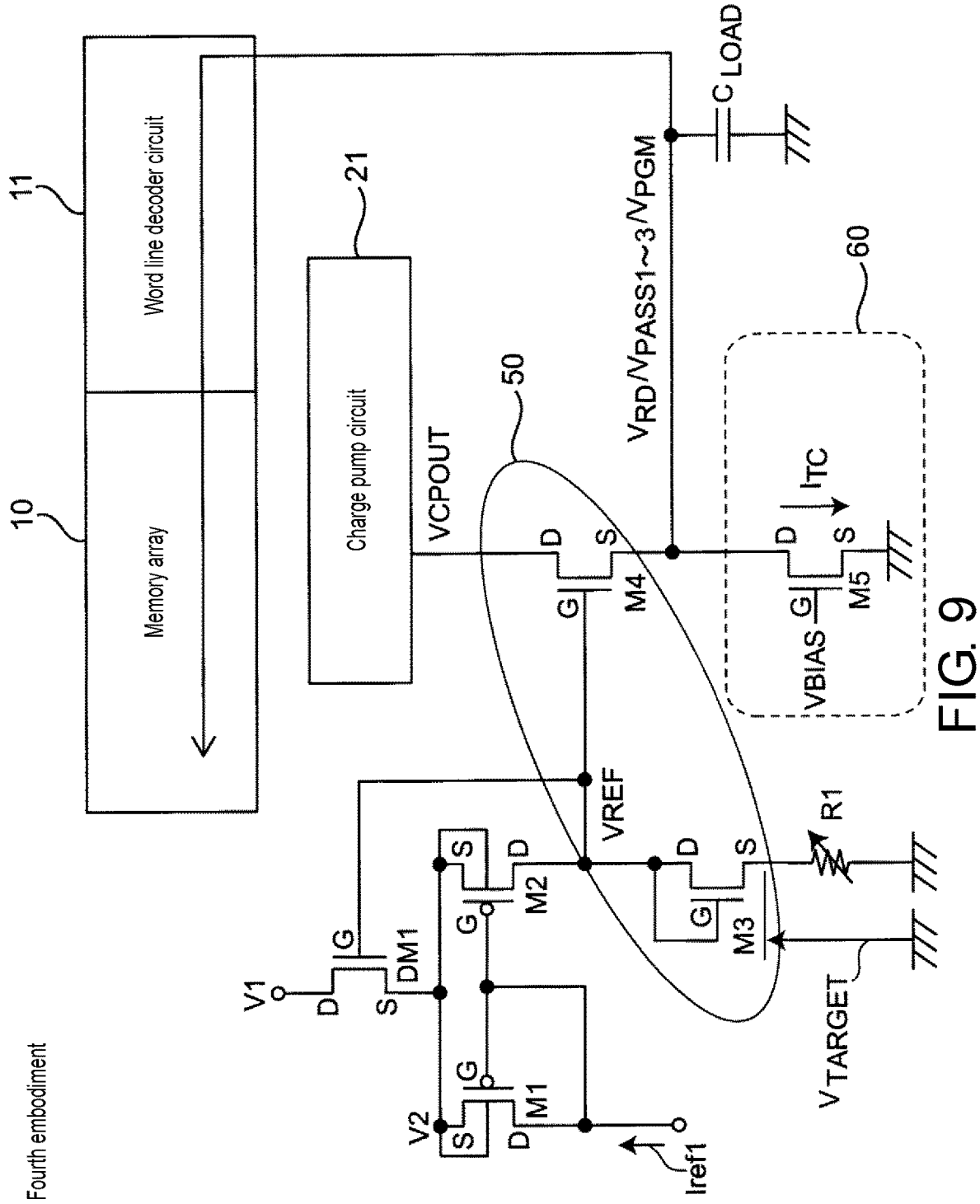
FIG. 9 is a block diagram showing a configuration example of a voltage generator used in an NAND flash memory in fourth embodiment.

FIG. 9 is a block diagram showing a configuration example of a voltage generator used in an NAND flash memory in fourth embodiment. Although the voltage generator of FIG. 7 reduces noise, the accuracy of output voltage is still not high enough. In order to solve this problem, the voltage generator of FIG. 9 is proposed.

In FIG. 9, the current mirror circuit 50 is configured by the MOS transistor M3 and a MOS transistor M4, and a source follower circuit 60 is configured to apply various appropriate voltages to each node of the memory array 10. In order to force each voltage to the appropriate voltage, a predetermined bias gate voltage VBIAS is applied to a MOS transistor M5 so the MOS transistor M5 of the source follower circuit 60 connected in series with the MOS transistor M4 make a tail current ITC. Furthermore, $C_{LOAD}$ represents a parasitic capacitance of the voltage supply line.

According to the voltage generator of FIG. 9 described above, current density between the MOS transistor M3 and the MOS transistor M4 becomes the same. Since those current densities are the same, the threshold voltage Vth of the MOS transistor M4 is identical to the threshold voltage Vth of the MOS transistor M3. As a result, the target voltage $V_{TARGET}$ is correctly transferred to the memory array 10 and supplies each of the voltage $V_{RD}$, the voltage $V_{PASS1}$ to voltage $V_{PASS3}$, and the voltage VPGM.

Modification

Although the foregoing embodiments are described by using the voltage generator for the NAND flash memory, the invention is not limited thereto but can also be applied to various other non-volatile semiconductor storage devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A current-voltage convertor, comprising:
    a first current mirror circuit, comprising a first metal-oxide semiconductor transistor and a second metal-oxide semiconductor transistor in a pair, and an output resistor;
    a depletion type N-channel metal-oxide semiconductor transistor, inserted between a first voltage as input and the pair of the first metal-oxide semiconductor transistor and the second metal-oxide semiconductor transistor,
    when a reference current is input to the first metal-oxide semiconductor transistor, a first output voltage is generated by a current corresponding to the reference current via the second metal-oxide semiconductor transistor and the output resistor, and the first output voltage is connected to a gate of the depletion type N-channel metal-oxide semiconductor transistor;
    a third metal-oxide semiconductor transistor, inserted between the second metal-oxide semiconductor transistor and the output resistor, and having a gate and a drain connected to each other; and
    a fourth metal-oxide semiconductor transistor, clamping a second voltage based on the first output voltage, wherein
    the third metal-oxide semiconductor transistor and the fourth metal-oxide semiconductor transistor are configured as a second current mirror circuit, and
    a reference voltage is output based on a second output voltage from the fourth metal-oxide semiconductor transistor.

2. A reference voltage generator, comprising the current-voltage convertor according to claim 1, wherein the reference voltage generator is configured to:
    output a reference voltage based on the second output voltage of the current-voltage convertor.

3. The reference voltage generator according to claim 1, further comprising: a source follower circuit, supplying the second output voltage, and being connected to a source of the fourth metal-oxide semiconductor transistor to make a predetermined current flow.

4. A non-volatile semiconductor storage device comprising a memory array, wherein the non-volatile semiconductor storage device comprises:
    the reference voltage generator according to claim 1, wherein
    the second output voltage from the reference voltage generator is supplied to the memory array of the non-volatile semiconductor storage device.

5. A non-volatile semiconductor storage device comprising a memory array, wherein the non-volatile semiconductor storage device comprises:
    the reference voltage generator according to claim 2, wherein
    the second output voltage from the reference voltage generator is supplied to the memory array of the non-volatile semiconductor storage device.

6. The reference voltage generator according to claim 3, wherein the source follower circuit comprises a fifth metal-oxide semiconductor transistor having a gate forced to a predetermined bias voltage.

7. A non-volatile semiconductor storage device comprising a memory array, wherein the non-volatile semiconductor storage device comprises:
    the reference voltage generator according to claim 3 wherein
    the second output voltage from the reference voltage generator is supplied to the memory array of the non-volatile semiconductor storage device.

8. A non-volatile semiconductor storage device comprising a memory array, wherein the non-volatile semiconductor storage device comprises:
    the reference voltage generator according to claim 6 wherein
    the second output voltage from the reference voltage generator is supplied to the memory array of the non-volatile semiconductor storage device.

* * * * *